(12) United States Patent
Chung (10) Patent No.: US 10,383,242 B1
(45) Date of Patent: Aug. 13, 2019

(54) ELECTRONIC DEVICE (71) Applicants: Inventec (Pudong) Technology Corporation, Shanghai (CN); INVENTEC CORPORATION, Taipei (TW)

(72) Inventor: Tzu-Yi Chung, Taipei (TW)

(73) Assignees: Inventec (Pudong) Technology Corporation, Shanghai (CN); INVENTEC CORPORATION, Taipei (TW)

(*) Notice: Subject to any disclaimer, the term of this patent is extended or adjusted under 35 U.S.C. 154(b) by 0 days.

(21) Appl. No.: 16/215,591

(22) Filed: Dec. 10, 2018

(30) Foreign Application Priority Data

Nov. 21, 2018 (CN) .......................... 2018 1 1387931

(51) Int. Cl.
*H05K 7/14* (2006.01)
*H05K 5/02* (2006.01)

(52) U.S. Cl.
CPC ........... *H05K 5/023* (2013.01); *H05K 5/0221* (2013.01); *H05K 7/1487* (2013.01); *H05K 7/1489* (2013.01)

(58) Field of Classification Search
CPC .... H05K 7/1485; H05K 7/1489; H05K 10/00; G06F 1/184; G06F 21/50
See application file for complete search history.

(56) References Cited

U.S. PATENT DOCUMENTS

| | | | | |
|---|---|---|---|---|
| 3,932,716 A * | 1/1976 | Mottel | ................... | H01H 9/20 200/50.02 |
| 4,071,722 A * | 1/1978 | Hart | ................... | H01H 9/20 200/50.1 |
| 4,872,853 A * | 10/1989 | Webster | ................... | H01R 13/639 439/327 |
| 5,483,419 A * | 1/1996 | Kaczeus, Sr. | ................... | G06F 13/4081 312/274 |
| 6,147,878 A * | 11/2000 | Heselton | ................... | H05K 7/1409 361/754 |
| 6,483,717 B1 * | 11/2002 | Ives | ................... | H05K 7/1414 361/759 |
| 7,264,490 B1 * | 9/2007 | Reznikov | ................... | H01R 13/62933 439/152 |
| 10,219,401 B1 * | 2/2019 | Chang | ................... | H05K 7/1489 |
| 2003/0002261 A1 * | 1/2003 | Berry | ................... | H05K 7/1489 361/727 |
| 2007/0041257 A1 * | 2/2007 | Kim | ................... | G11C 7/08 365/207 |
| 2007/0047180 A1 * | 3/2007 | Wirtzberger | ................... | H05K 7/1457 361/600 |

* cited by examiner

*Primary Examiner* — Adrian S Wilson
(74) *Attorney, Agent, or Firm* — CKC & Partners Co., LLC (57) ABSTRACT

An electronic device includes a main body, a handle, a fastening block element, a controlling unit, and a driving element. The handle is connected to one side of the main body and has a fastening groove. The fastening block element is disposed in the main body and detachably engaged with the fastening groove. The controlling unit is disposed in the main body and sends an unlocking signal after a shutdown process is performed. The driving element is disposed in the main body and electrically connected to the controlling unit. After the driving element receives the unlocking signal, the fastening block element is released from the fastening groove, thereby enabling the handle to protrude from the main body.

8 Claims, 13 Drawing Sheets

ELECTRONIC DEVICE

CROSS-REFERENCE TO RELATED APPLICATION

This application claims priority to China Application Serial Number 201811387931.6, filed Nov. 21, 2018, which is herein incorporated by reference in its entirety.

BACKGROUND

Technical Field

The present disclosure relates to an electronic device, and more particularly to an electronic device which may be replaced only after the system has completed a shutdown process.

Description of Related Art

For conventional racks or blade servers currently in the market, it has been already described in operation manuals that a user has to wait for the system to be completely shut down before replacing the electronic device. However, in actual operations, the user may just open a casing and release latches, and then replaces the electronic device without waiting for the system to be completely shut down. In other words, even though having pressed the shutdown button, the user usually does not wait for the system to be completely shut down before replacing the electronic device.

Although the system may be shut down in an emergency power-off mode in response to the act of electronic device replacement that occurs under normal operation of the system, the system is still turned off by an abnormal shutdown process. Therefore, it is one of the important research topics in the server industry regarding how to establish a mistake-proofing mechanism for the user to replace the electronic device only when the system has completed shutdown.

SUMMARY

The disclosure provides an electronic device, and more particularly to an electronic device which may be replaced only after the system has completed shutdown.

According to some embodiments of the present disclosure, an electronic device includes a main body, a handle, a fastening block element, a controlling unit, and a driving element. The handle is connected to one side of the main body and has a fastening groove. The fastening block element is disposed in the main body and detachably engaged with the fastening groove. The controlling unit is disposed in the main body and the controlling unit sends an unlocking signal after a shutdown process is performed. The driving element is disposed in the main body and electrically connected to the controlling unit. After the driving element receives the unlocking signal, the fastening block element is released from the fastening groove, thereby enabling the handle to protrude from the main body.

According to some embodiments of the present disclosure, the driving element is a motor and the fastening block element is a screw. The motor drives the screw away from the fastening groove linearly.

According to some embodiments of the present disclosure, the handle further includes a pivot end and a fixed end opposite to the pivot end. The pivot end is pivotally connected to the main body. The fastening groove is disposed on the fixed end.

According to some embodiments of the present disclosure, the electronic device further includes an elastic member. The pivot end of the handle is pivotally connected to the main body through the elastic member.

According to some embodiments of the present disclosure, the main body includes a limiting slot, and the handle further includes a holding portion and an engaging portion connected the holding portion. The fastening groove is disposed on the engaging portion. The electronic device further includes a spring disposed in the limiting slot. When the handle is attached to a surface of the main body, the spring abuts against the engaging portion of the handle in a pre-pressure manner.

According to some embodiments of the present disclosure, when the fastening groove is engaged with the fastening block element, the handle is level with a surface of the main body.

According to some embodiments of the present disclosure, the electronic device further includes a sliding rail disposed on the main body. The handle further includes a sliding block coupled to the sliding rail. The handle is movably connected to the main body.

According to some embodiments of the present disclosure, the sliding block and the fastening groove are respectively disposed on opposite sides of the handle.

In summary, an electronic device includes a main body, a handle, a fastening block element, a controlling unit, and a driving element. In this electronic device, the controlling unit will send an unlocking signal after a shutdown process is performed. After the driving element receives the unlocking signal, the fastening block element is released from the fastening groove, thereby enabling the handle to protrude from the main body. By using this mistake-proofing mechanism, the user may use the handle to remove the main body only after the system has been completed shut down.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiments, with reference made to the accompanying drawings as follows.

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts.

Figure 1:
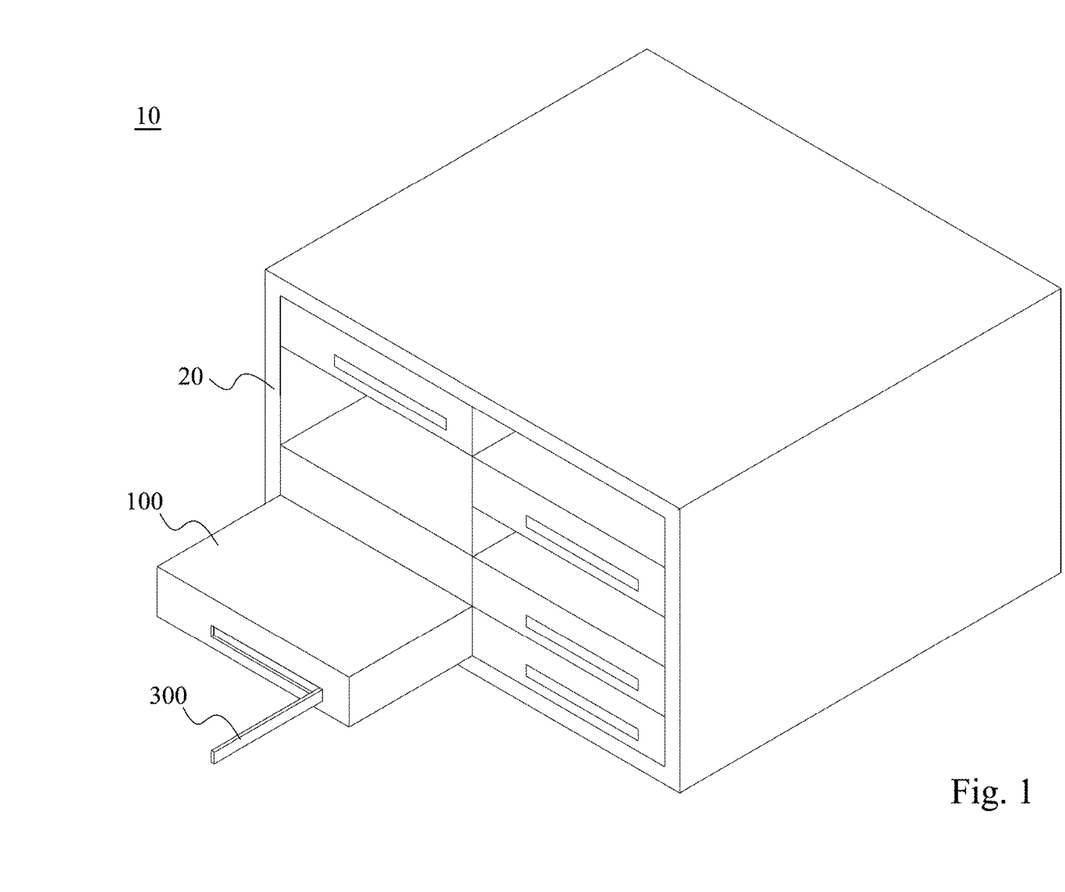
FIG. 1 is a schematic stereoscopic view showing plural electronic devices disposed in a chassis in accordance with one embodiment of the present disclosure.

Referring to FIG. 1, FIG. 1 is a schematic stereoscopic view of a server 10 in accordance with one embodiment of the present disclosure, illustrating plural electronic devices of the present disclosure disposed in a chassis 20. In some embodiments, the server 10 may be a rackmount server or a blade server, but the disclosure is not limited thereto. As shown in FIG. 1, the server 10 includes the chassis 20 and the electronic devices, and each of the electronic devices includes a main body 100, and a handle 300 disposed on the main body 100. The chassis 20 may accommodate plural main bodies 100. A user may replace different main bodies 100 through the handles 300 according to actual needs.

Figure 2:
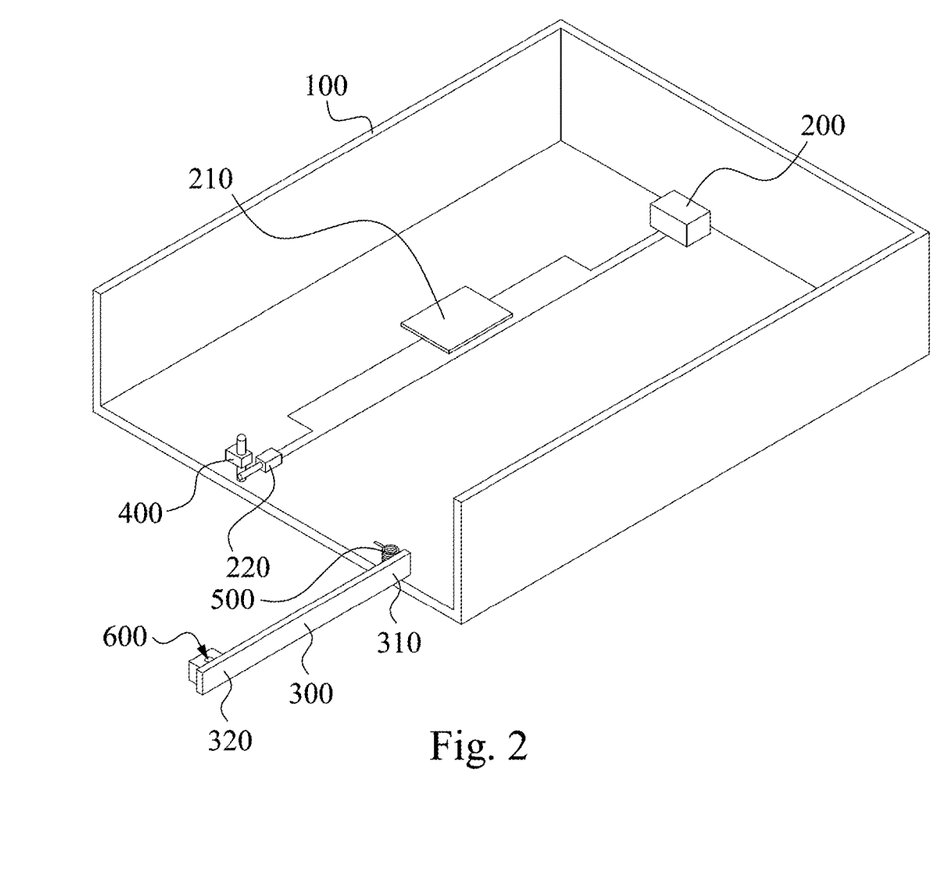
FIG. 2 is a schematic view of an electronic device in accordance with one embodiment of the present disclosure.

Referring to FIG. 2, FIG. 2 is a schematic view of an electronic device in accordance with FIG. 1. As shown in FIG. 2, the electronic device includes the main body 100, a power source 200, a controlling unit 210, a driving element 220, the handle 300, a fastening block element 400, an elastic member 500, and a fastening groove 600. For clearly illustrating the technical features of the present disclosure, it is noted herein that FIG. 2 only shows the causing in the main body 100, and does not show the electronic components, such as the main board and the fan, disposed in the main body 100. The power source 200 is electrically connected to a standby power source disposed on the chassis 20 of FIG. 1, and is also electrically connected to the controlling unit 210 and the driving element 220. Furthermore, the controlling unit 210 is electrically connected to the driving element 220, and the controlling unit 210 may be controlled to actuate the driving element 220, thereby driving the fastening block element 400 connected to the driving element 220 to escape from the fastening groove 600.

In the present embodiment, the controlling unit 210 may be, for example, a Complex Programmable Logic Device (CPLD), and is electrically connected to the driving element 220. The driving element 220 may be a motor, such as a linear motor or a stepping motor. The driving element 220 is electrically connected to the controlling unit 210. When the user desires to pull the electronic device out of the chassis 20, the controlling unit 210 will send an unlocking signal after the shutdown process is performed. After the driving element 220 receives the unlocking signal, the driving element 220 drives the fastening block element 400 to leave the fastening groove 600. In the greater detail, the baseboard management controller (BMC) installed on the server chassis and the controlling unit 210 in the main body 100 are still powered on and in the working state after the system of the electronic device completes the shutdown process. As a result, the driving element 220 electrically connected to the controlling unit 210 is still in the working state after the electronic device is turned off, and may receive the unlocking signal sent by the controlling unit 210, thereby driving the fastening block element 400 to move. In some embodiments, the fastening blocking element 400 may be, for example, a screw. After the electronic device is turned off, the controlling unit 210 sends the unlocking signal. After the driving element 220 receives the unlocking signal, the driving element 220 drives the screw to move away from the fastening groove 600 linearly such that the handle 300 protrudes from the main body 100.

In some embodiments, the length of the handle 300 is not limited to a specific value and is based on the actual needs by the user. The handle 300 includes a pivot end 310 and a fixed end 320 opposite to the pivot end 310. The pivot end 310 is connected to one side of the main body 100 through an elastic member 500. The fastening groove 600 is disposed on the fixed end 320 of the handle 300, and corresponds to the fastening block element 400. The fastening block element 400 is detachably engaged with the fastening groove 600. For example, after the fastening block element 400 is engaged with the fastening groove 600 on the handle 300, the handle 300 does not protrude from the surface of the main body 100. The handle 300 is level with the surface of the main body 100, that is, the user cannot pull out the main body 100 by holding the handle 300 on the surface of the main body 100.

In the present embodiment, only after the controlling unit 210 performs the shutdown process and then the controlling unit 210 sends the unlocking signal to the driving element 220, the driving element 220 receives the unlocking signal to drive the fastening block element 400 away from the fastening groove 600. As a result, the fixed end 320 of the handle 300 is disengaged from the surface of the main body 100 and is provided for the user to hold on. In other words, after the handle 300 is engaged with the main body 100, only the driving element 220 may drive the fastening block element 400 to be released from the fastening groove 600, and the users cannot release the fastening block element 400 from the fastening groove 600 by themselves, thereby preventing the users from pulling out the main body 100 through the handle 300 while the system is not in the off state.

Figure 3A:
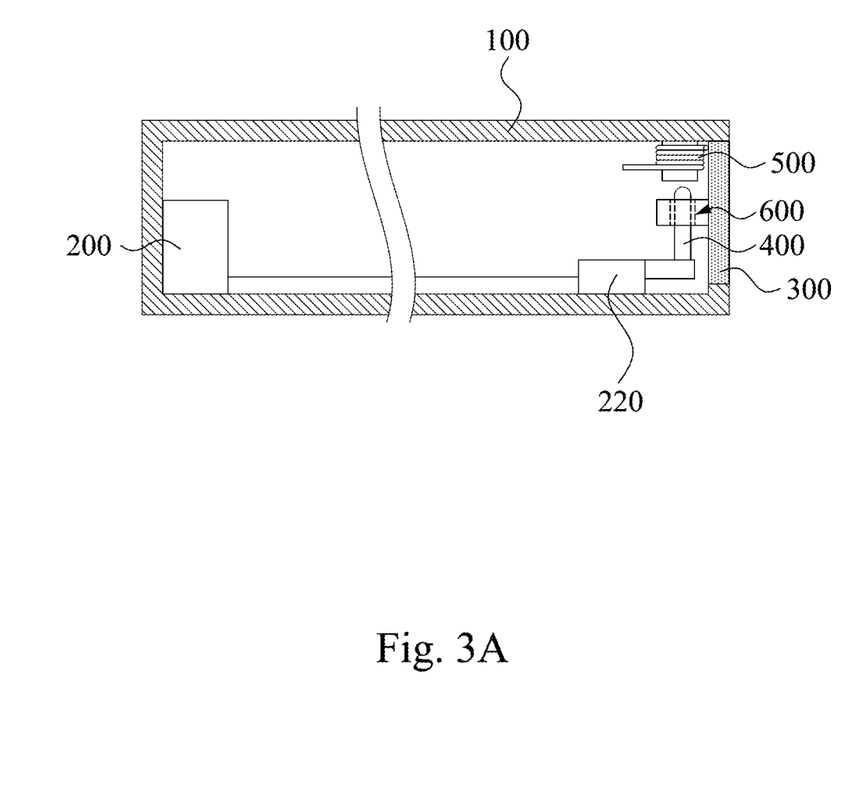
FIGS. 3A to 3C are schematic cross-sectional views showing the electronic device that is being withdrawn and replaced in accordance with one embodiment of the present disclosure.
Figure 3B:
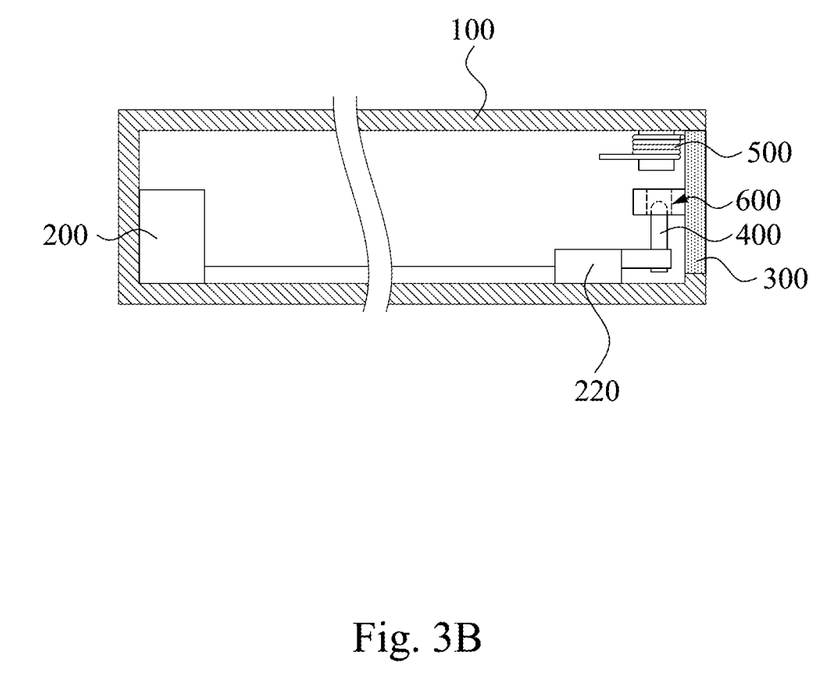
Figure 3C:
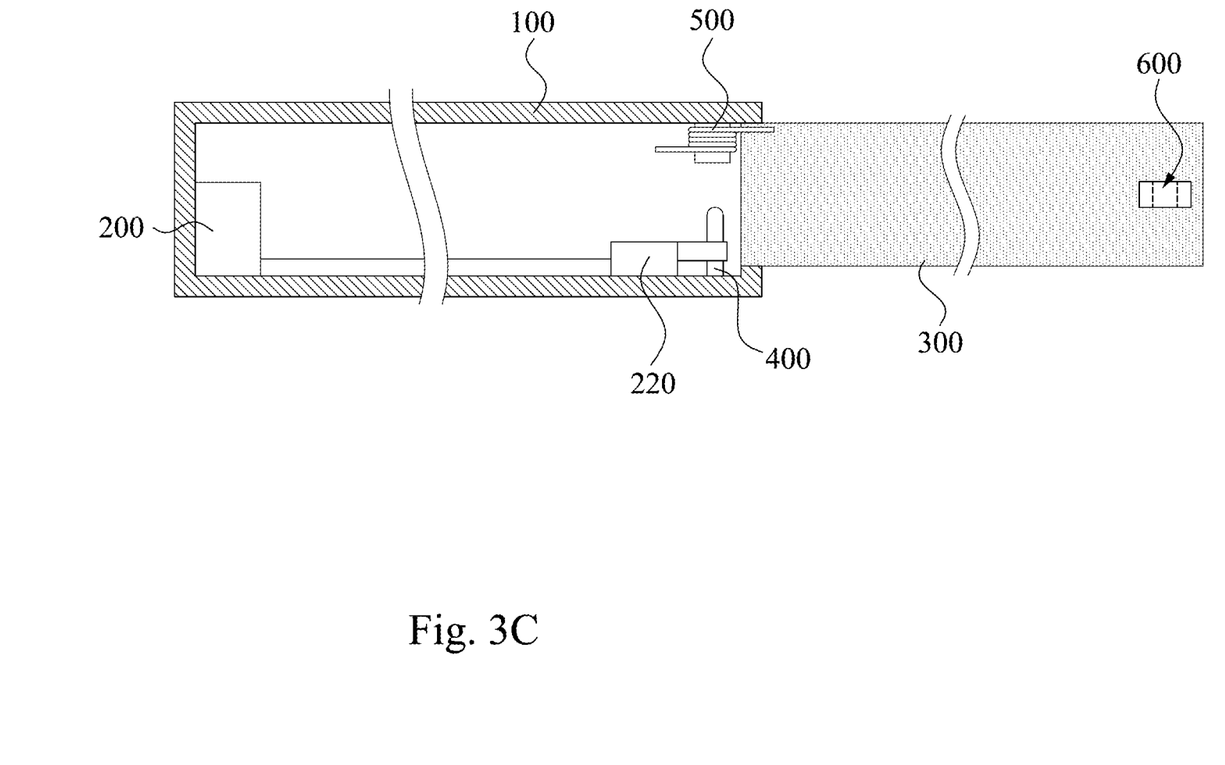

Referring to FIGS. 3A to 3C, FIGS. 3A to 3C are schematic cross-sectional views showing the electronic device that is being withdrawn and replaced in accordance with one embodiment of the present disclosure. As shown in FIG. 3A, the electronic device includes a main body 100, a power source 200, a driving element 220, a handle 300, a fastening block element 400, an elastic member 500, and a fastening groove 600. The fastening block element 400 is detachably engaged with the fastening groove 600 which is disposed on the handle 300. The handle 300 is pivotally connected to one side of the main body 100 through the elastic member 500. In the condition that the electronic device is turned on, the fastening block element 400 is engaged with the fastening groove 600 such that the handle 300 is attached to the surface of the main body 100. In some embodiments, the elastic member 500 may be a torsion spring for pivoting the handle 300 to one side of the main body 100, but the disclosure is not limited thereto.

Referring to FIG. 3B, when the shutdown process is performed by the user, the controlling unit 210 (as shown in FIG. 2) connected to the power source 200 will send an unlocking signal to the driving element 220 after the shutdown process has been completed. At this time, the driving element 220 receives the unlocking signal and then drives the fastening block element 400 which is connected to the driving element 220 to be released from the fastening groove 600.

Referring to FIG. 3C, after the fastening block element 400 is disengaged from the fastening groove 600, the elastic force provided by the elastic member 500 drives the handle 300 to be ejected onto the surface of the main body 100. In this case, the user may hold the handle 300 and then pull out the main body 100.

In the greater detail, while the electronic device is in operation, the handle 300 does not protrude the surface of the main body 100 for the user to hold on and to replace the electronic device. After the power is completely turned off, the controlling unit 210 sends an unlocking signal. The driving element 220 receives the unlocking signal and drives the fastening block element 400 to disengage from the fastening groove 600 such that the elastic member 500 ejects the handle 300. As a result, the user may hold on one end of the handle 300 having the fastening groove 600 to pull out the main body 100.

Figure 4:
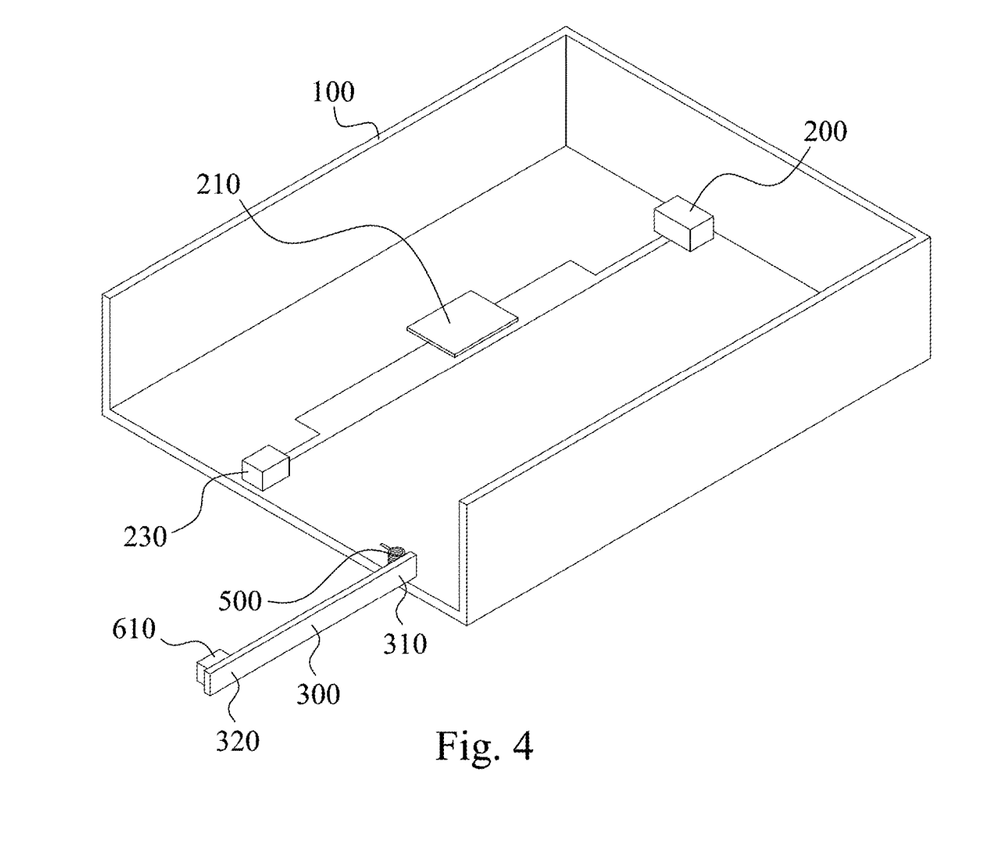
FIG. 4 is a schematic view of the electronic device in accordance with another embodiment of the present disclosure.

FIG. 4 is a schematic view of the electronic device in accordance with another embodiment of the present disclosure. As shown in FIG. 4, the disclosure may also use a magnetic lock to replace the mechanical fastening block structure. The position of fastening groove 600 disposed on the handle 300 is replaced by a magnet 610, and the fastening block element 400 and the driving element 220 are replaced by an electromagnet 230. The controlling unit 210 is electrically connected to the electromagnet 230. After the controlling unit 210 performs a shutdown process, the controlling unit 210 sends an unlocking signal to the electromagnet 230. After the electromagnet 230 receives the unlocking signal, the magnetic force is reduced, and the magnet 610 on the handle 300 is separated from each other. As a result, the handle 300 protrudes from the main body 100. The purpose of the present disclosure may also be achieved in this manner.

Figure 5:
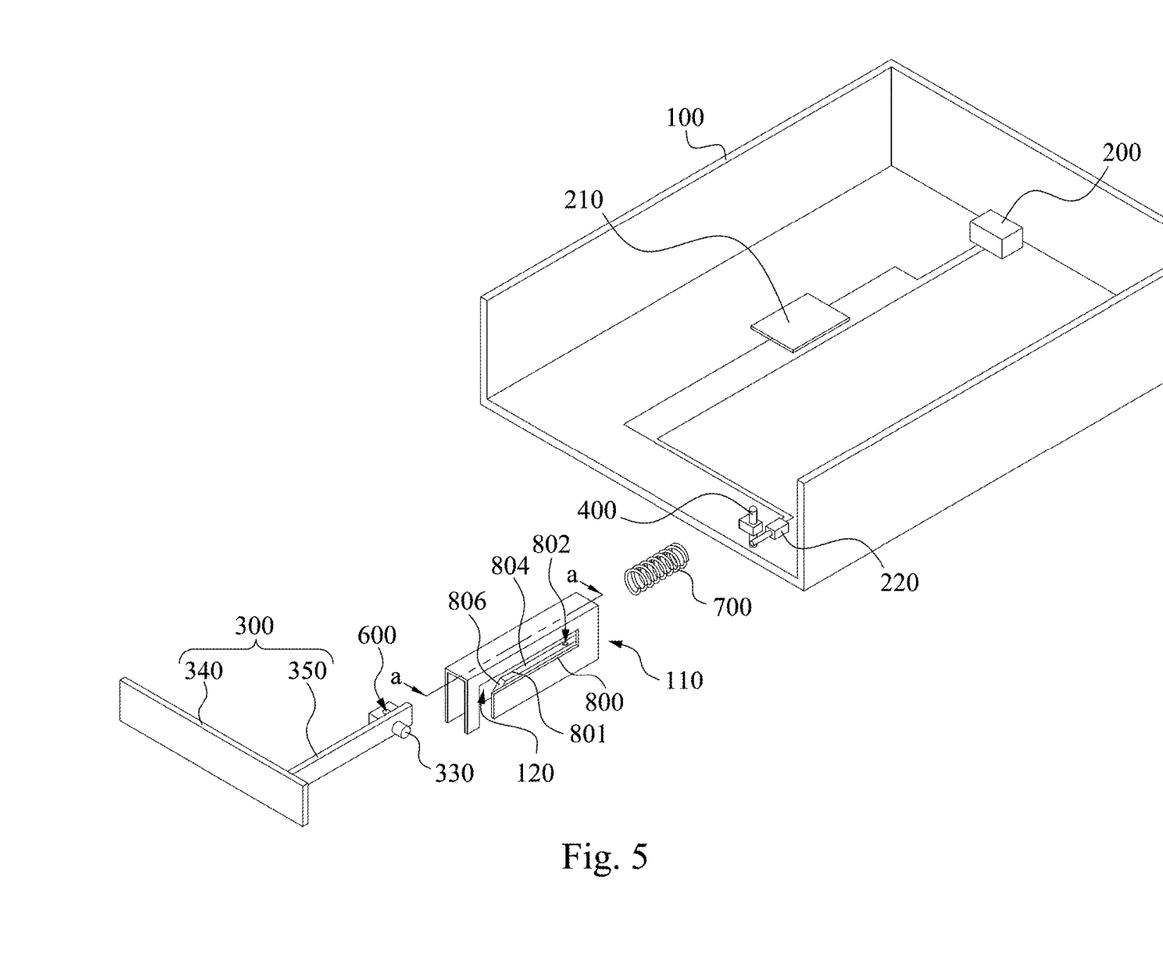
FIG. 5 is a schematic exploded view of the electronic device in accordance with another embodiment of the present disclosure.
Figure 6A:
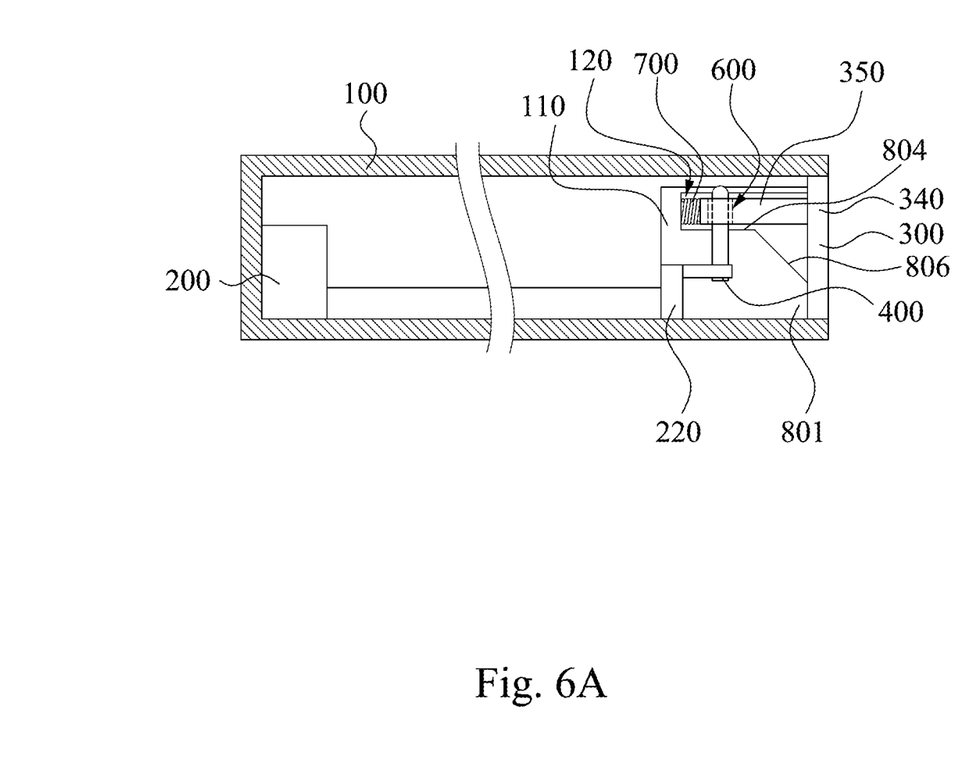
FIGS. 6A to 6C are schematic cross-sectional views of FIG. 5 showing the electronic device that is being withdrawn and replaced.
Figure 6B:
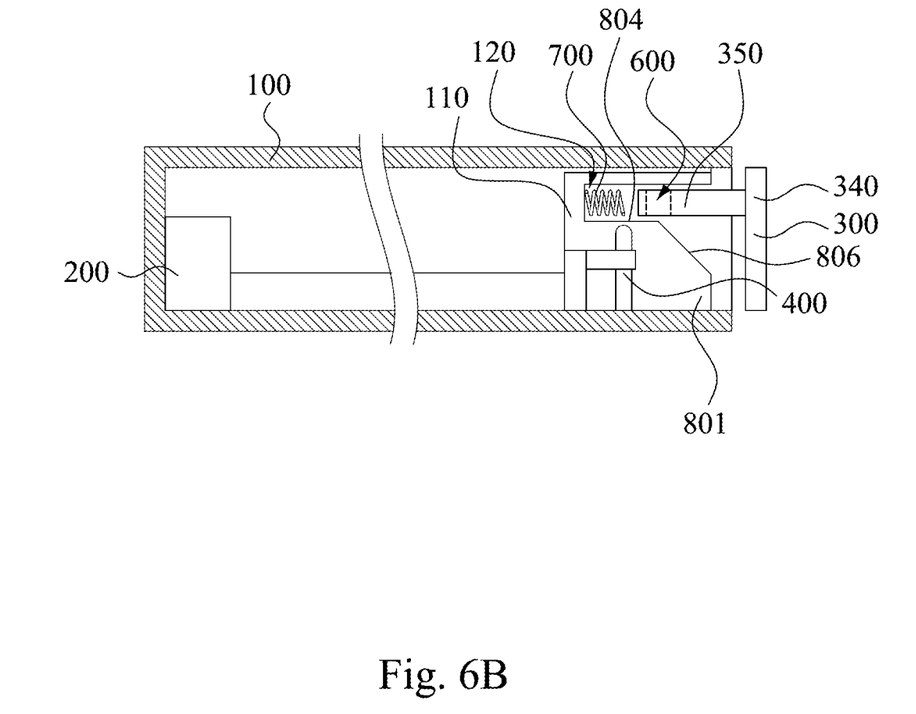
Figure 6C:
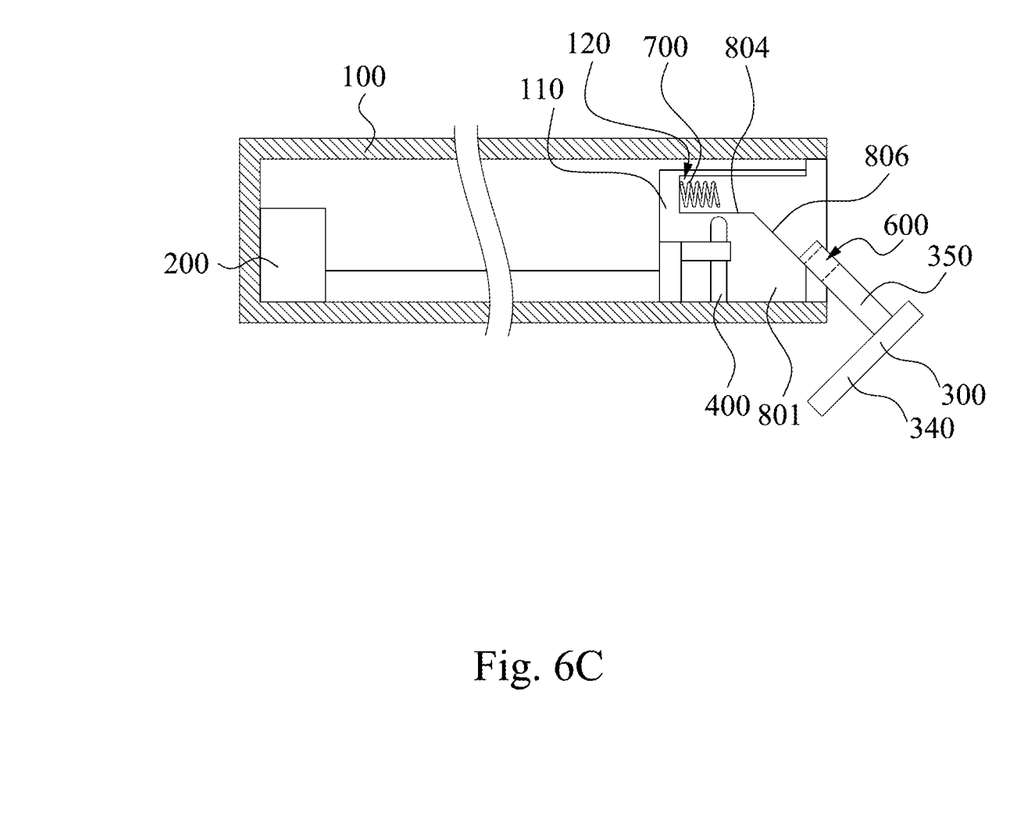

Referring to FIGS. 5, and 6A to 6C, FIG. 5 is a schematic exploded view of the electronic device in accordance with another embodiment of the present disclosure, and FIGS. 6A to 6C are schematic cross-sectional views of FIG. 5 showing the electronic device being replaced. The cross-section views of FIGS. 6A to 6C are viewed from a-a line in FIG. 5. As shown in FIGS. 5 and 6A, the electronic device includes a main body 100, a power source 200, a driving element 220, a handle 300, a fastening block element 400, a fastening groove 600, a spring 700, and a stationary base 110. The fastening block element 400 is detachably engaged with the fastening groove 600 disposed on the handle 300. In some embodiments, the handle 300 includes a sliding block 330. The sliding block 330 and the fastening groove 600 are respectively disposed on opposite sides of the handle 300. For example, as shown in FIG. 5, the sliding block 330 is disposed outside the handle 300, and the fastening groove 600 is disposed inside the handle 300.

As shown in FIGS. 5 and 6A, the stationary base 110 is disposed on the main body 100. The stationary base 110 includes a sliding rail 800, a supporting base 801 and a limiting slot 120. The stationary base 110 has a hollow structure. For example, in the present embodiment, the stationary base 110 has a substantially reversed U-shaped hollow structure. The sliding rail 800 is disposed on a sidewall of the stationary base 110. The supporting base 801 is disposed in the stationary base 110. The fastening block element 400 is accommodated in the supporting base 801, and the supporting base 801 has a hole 802. As a result, the fastening block element 400 may be inserted into the hole 802 to be telescopically fastened with the fastening groove 600 on the handle 300.

The space between the stationary base 110 and the supporting base 801 defines a limiting slot 120 for accommodating the handle 300. For example, the handle 300 includes a holding portion 340 and an engaging portion 350 connected to the holding portion 340. The engaging portion 350 and the holding portion 340 are substantially L-shaped, and the holding portion 340 is a portion for the user to hold on. The engaging portion 350 is accommodated in the limiting slot 120. The fastening groove 600 and the sliding block 330 are respectively disposed on two sides of the engaging portion 350. The electronic device further includes a spring 700 disposed in the limiting slot 120. One end of the spring 700 abuts against the bottom end of the limiting slot 120, and the other end of the spring 700 abuts against the engaging portion 350 of the handle 300. When the handle 300 is attached to the surface of the main body 100 (as shown in FIG. 6A), the spring 700 is compressed to abut against the engaging portion 350 of the handle 300 in a pre-pressure manner.

The sliding block 330 of the handle 300 is coupled to the sliding rail 800 on the sidewall of the stationary base 110 for restricting the movement path of the handle 300 in the stationary base 110. The shape of the sliding rail 800 may be the same as or different from the shape of the supporting base 801. For example, in the present embodiment, the shape of the sliding rail 800 is L-shaped, and the shape of the supporting base 801 is a trapezoid with a flat top face 804 and an inclined face 806.

Referring to FIG. 6B, when the shutdown process is performed by the user, the controlling unit 210 (as shown in FIG. 5) connected to the power source 200 will send an unlocking signal to the driving element 220 after the shutdown process is executed. At this time, the driving element 220 receives the unlocking signal and then drives the connected fastening block element 400 away from the fastening groove 600. When the fastening block element 400 is disengaged from the fastening groove 600, the spring force of the spring 700 is restored to eject the handle 300, such that the handle 300 protrudes from the surface of the main body 100. At this time, the engaging portion 350 of the handle 300 is still disposed in the limiting slot 120 and substantially parallel to the top face 804 of the supporting base 801.

Referring to FIG. 6C, in some embodiments, if the spring 700 provides a sufficient spring force, the handle 300 will naturally hang along the inclined face 806 of the supporting base 801 after the handle 300 is ejected, thereby driving the sliding block 330 (as shown in FIG. 5) on the sliding rail 800 (as shown in FIG. 5) to slide from one end to the other end of the sliding rail 800.

Alternatively, in other embodiments, after the handle 300 is ejected, the user may grasp the holding portion 340 of the handle 300 to continue pulling the handle 300 along the track of the sliding rail 800, and then the engaging portion 350 of the handle 300 naturally hangs along the inclined face 806 of the supporting base 801.

By the design of the sliding path of the handle 300 described above, time for the user to pull out the main body 100 may be further extended, and the operational experience may be improved. In summary, in the case of not being in the complete shutdown state, there is no handle 300 on the surface of the main body 100 for the user to pull out the electronic device. The handle 300 is ejected only after the electronic device is turned off, and then the user may hold on the handle 300 to pull out the main body connected to the handle 300.

Figure 7A:
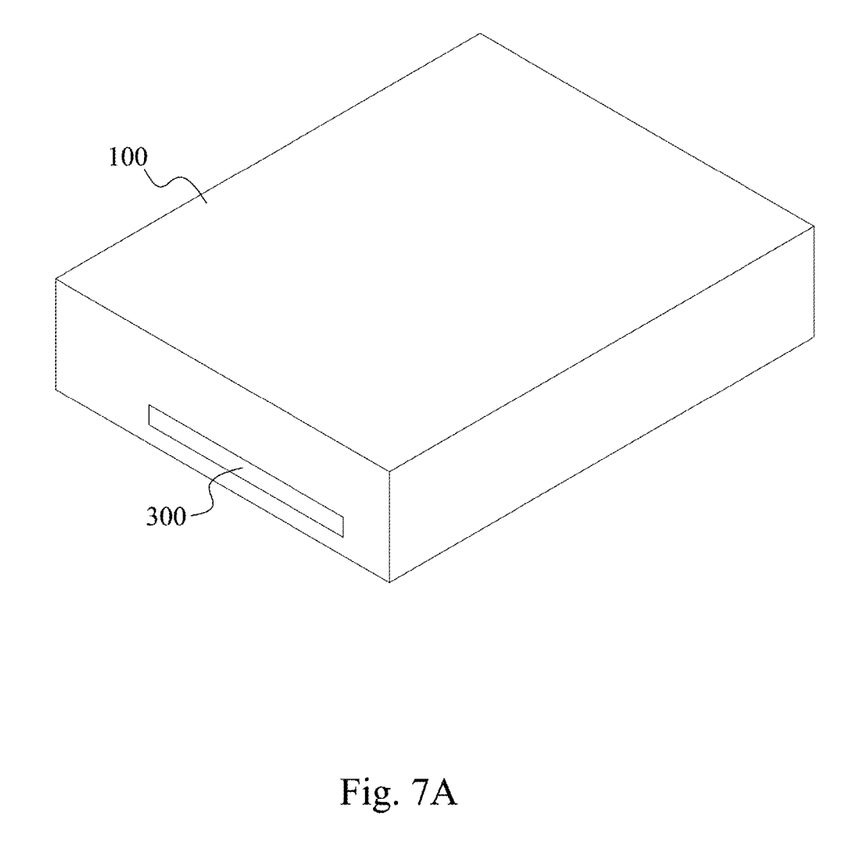
FIGS. 7A to 7C are schematic views showing the electronic device that is being withdrawn and replaced in accordance with one embodiment of the present disclosure.
Figure 7B:
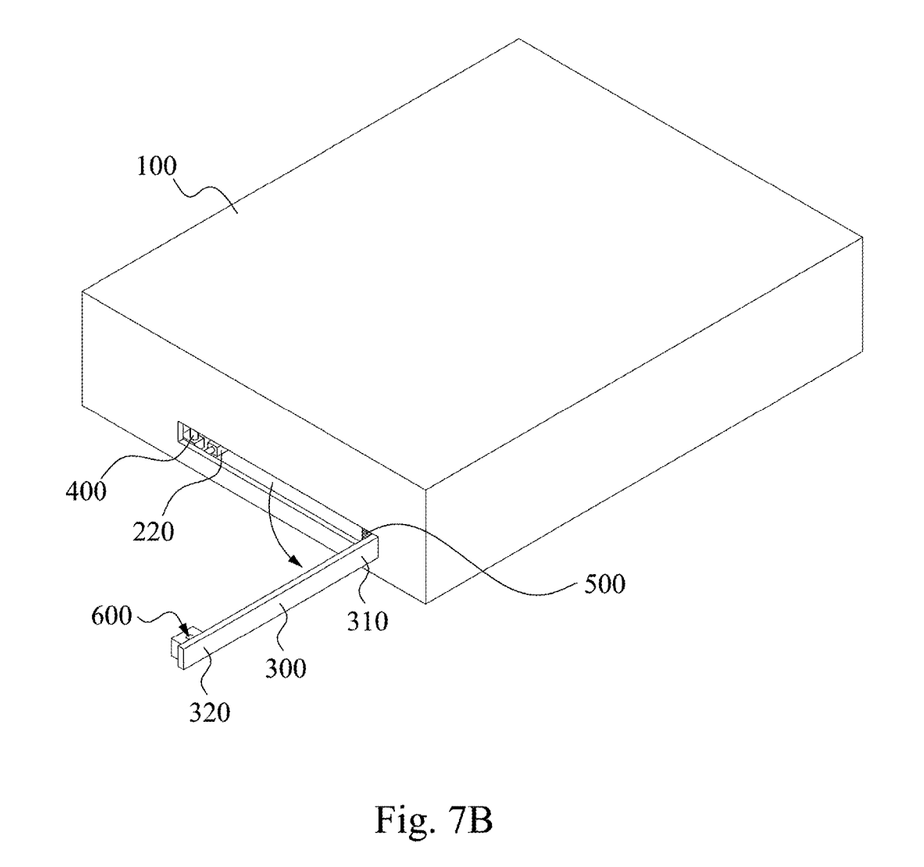
Figure 7C:
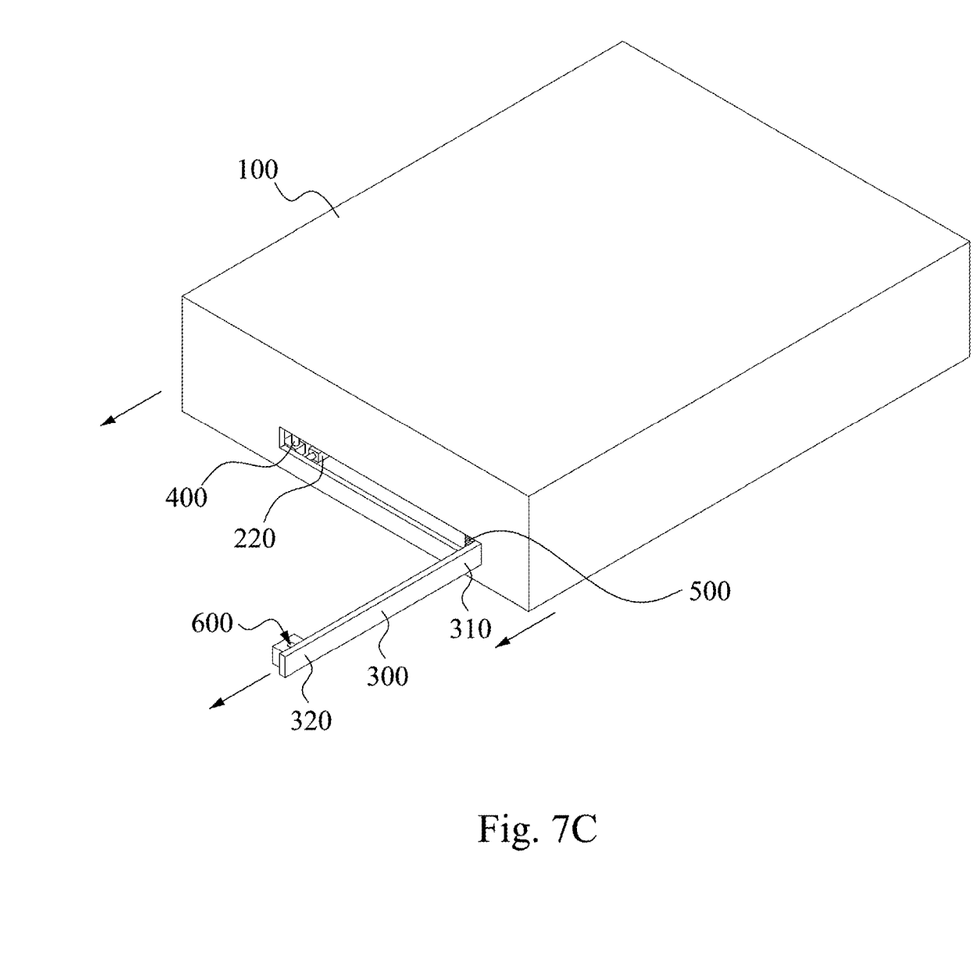

FIGS. 7A to 7C are schematic views showing the electronic device that is being withdrawn and replaced in accordance with one embodiment of the present disclosure. Referring to FIG. 7A, the electronic device includes a main body 100 and a handle 300 attached to the surface of the main body 100. As described above, in the case that the electronic device is turned on, the handle 300 is level with the surface of the main body 100, and the handle 300 does not protrude from the surface of the main body 100. As a result, the user does not have the handle 300 to pull out the main body 100.

Referring to FIGS. 7B and 7C, when the shutdown process is performed by the user, the controlling unit 210 (as shown in FIG. 5) sends an unlocking signal to the driving element 220 after the system is powered off. At this time, the driving element 220 drives the fastening block element 400 connected thereto after receiving the unlocking signal, such that the fastening block element 400 is disengaged from the fastening groove 600. After the fastening block element 400 is disengaged from the fastening groove 600, the elastic force provided by the elastic member 500 drives the handle 300 to be ejected. In this case, the user may replace the main body 100 by holding on the handle 300. In the greater detail, while the electronic device is working, there is no handle 300 on the surface of the main body 100 for the user to replace the electronic device, and the handle 300 is ejected only after the system is completely powered off. As a result, the user may hold on one end of the handle 300 having the fastening groove 600 to pull out the main body 100.

In summary, the disclosure provides an electronic device. After a shutdown process is performed, the controlling unit will send an unlocking signal to the driving element. After the driving element receives the unlocking signal, the fastening block element is driven to be released from the fastening groove, thereby causing the handle to protrude from the main body. By using this mistake-proofing mechanism, the user may use the handle to remove the main body only after the system has completed shutdown.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An electronic device, comprising:
   a main body;
   a handle connected to one side of the main body and having a fastening groove;
   a fastening block element disposed in the main body and detachably engaged with the fastening groove;
   a controlling unit disposed in the main body, wherein the controlling unit sends an unlocking signal after a shutdown process is performed; and
   a driving element disposed in the main body and electrically connected to the controlling unit, wherein, after the driving element receives the unlocking signal, the fastening block element is driven to be released from the fastening groove, thereby enabling the handle to protrude from the main body.

2. The electronic device of claim 1, wherein the driving element is a motor, and the fastening block element is a screw, and the motor drives the screw away from the fastening groove linearly.

3. The electronic device of claim 1, wherein the handle further comprises a pivot end and a fixed end opposite to the pivot end, and the pivot end is pivotally connected to the main body, and the fastening groove is disposed on the fixed end.

4. The electronic device of claim 3, further comprising:
   an elastic member, wherein the pivot end of the handle is pivotally connected to the main body through the elastic member.

5. The electronic device of claim 1, wherein the main body comprises a limiting slot, the handle further comprising a holding portion and an engaging portion connected the holding portion, wherein the fastening groove is disposed on the engaging portion, the electronic device further comprising a spring disposed in the limiting slot, wherein while the handle is attached to a surface of the main body, the spring abuts against the engaging portion of the handle in a pre-pressure manner.

6. The electronic device of claim 1, wherein while the fastening groove is engaged with the fastening block element, the handle is level with a surface of the main body.

7. The electronic device of claim 5, further comprising:
   a sliding rail disposed on the main body, wherein the handle further comprises a sliding block coupled to the sliding rail, and the handle is movably connected to the main body.

8. The electronic device of claim 7, wherein the sliding block and the fastening groove are respectively disposed on opposite sides of the handle.

* * * * *